United States Patent

Chang et al.

[11] Patent Number: 6,069,063
[45] Date of Patent: May 30, 2000

[54] METHOD TO FORM POLYSILICON RESISTORS SHIELDED FROM HYDROGEN INTRUSION

[75] Inventors: Juin-Jie Chang, Tainan; Shih-Chi Lin, Taipei; Yen-Ming Chen; Yung-Lung Hsu, both of Hsin-Chu, all of Taiwan

[73] Assignee: Taiwan Semiconductor Manufacturing Company, Hsin-Chu, Taiwan

[21] Appl. No.: 09/283,841

[22] Filed: Apr. 1, 1999

[51] Int. Cl.[7] .................................................. H01L 21/425
[52] U.S. Cl. .......................... 438/528; 438/382; 438/783
[58] Field of Search .................................. 438/528, 563, 438/766, 783, 769, 382–384, 238

[56] References Cited

U.S. PATENT DOCUMENTS

| | | | |
|---|---|---|---|
| 5,236,857 | 8/1993 | Eklund et al. | 437/47 |
| 5,290,727 | 3/1994 | Jain et al. | 437/52 |
| 5,470,764 | 11/1995 | Ikegami et al. | 437/24 |
| 5,530,418 | 6/1996 | Hsu et al. | 338/307 |
| 5,728,615 | 3/1998 | Cheng et al. | 438/238 |
| 5,759,887 | 6/1998 | Ito et al. | 438/238 |
| 5,923,983 | 7/1999 | Fulford, Jr. et al. | 438/287 |
| 5,970,357 | 7/1999 | Chang | 438/382 |

OTHER PUBLICATIONS

Wolf et al., "Silicon Processing for the VLSI Era ," vol 1: Process Technology, Lattice Press, Sunset Beach, CA, (1986) p. 222.

*Primary Examiner*—Jey Tsai
*Attorney, Agent, or Firm*—George O. Saile; Stephen B. Ackerman; Rosemary L.S. Pike

[57] ABSTRACT

A method to form polysilicon resistors shielded from hydrogen intrusion is described. A semiconductor substrate is provided. Field oxide isolation regions are provided overlying the substrate. A polysilicon layer is deposited overlying the field oxide regions and the substrate. The polysilicon layer is etched away where it is not covered by a mask to form a polysilicon resistor. An interlevel dielectric layer is deposited overlying the polysilicon resistor. Nitrogen ions are implanted into the interlevel dielectric layer. The interlevel dielectric layer is annealed to form a silicon oxynitride shield layer in the interlevel dielectric layer. Contact openings are etched through the interlevel dielectric layer to the polysilicon resistor. The contact openings are filled with a metal layer. The metal layer is patterned. The patterned metal layer is covered with a passivation layer wherein the passivation layer contains hydrogen atoms and wherein the silicon oxynitride shield layer prevents hydrogen atoms from penetrating the polysilicon resistor. The integrated circuit is completed.

20 Claims, 6 Drawing Sheets

METHOD TO FORM POLYSILICON RESISTORS SHIELDED FROM HYDROGEN INTRUSION

BACKGROUND OF THE INVENTION

(1) Field of the Invention

The invention relates to a method of fabricating semiconductor structures, and more particularly, to the formation of polysilicon resistors shielded from hydrogen intrusion.

(2) Description of the Prior Art

Integrated circuits are a combination of various active components, such as transistors, with passive components, such as resistors. Resistors used in integrated circuits are often formed from undoped or lightly doped polysilicon. Such polysilicon has a relatively high resistivity from which large value resistors can be constructed using polysilicon traces while taking minimal area.

Unfortunately, polysilicon resistors also exhibit a tendency to absorb hydrogen atoms to which they are exposed during semiconductor processing. Hydrogen is used as an atmosphere during annealing operations. This hydrogen is absorbed into the polysilicon at trap locations in the grain boundaries. The presence of the hydrogen atoms effectively inactivates the trap locations. This causes the resistivity of the polysilicon to decrease. In addition, because the exposure to hydrogen can vary depending on many parameters, changes in the actual resistance values of the various resistors on the integrated circuit are not consistent.

Figure 1:
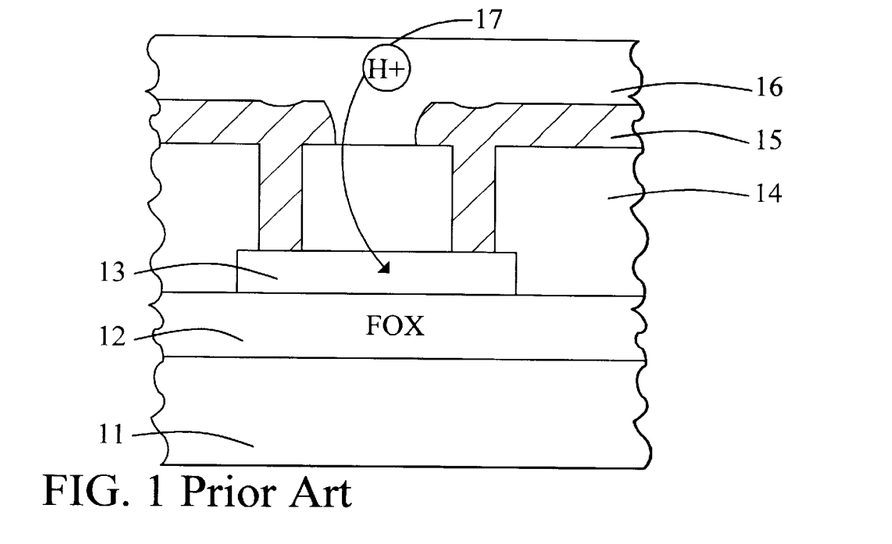
FIG. 1 schematically illustrates in cross-section a partially completed prior art polysilicon resistor showing atomic hydrogen diffusion from the plasma nitride to the polysilicon resistor.

A cross-sectional view of a partially completed prior art polysilicon resistor is shown in FIG. 1. The schematic shows a semiconductor substrate 11. Field oxide isolation layers 12 are grown on and in the substrate 11. A lightly doped polysilicon resistor 13 overlies the field oxide 12. An interlevel dielectric 14 overlies the polysilicon resistor 13 and field oxide 12. A metal layer 15 contacts the polysilicon resistor 13 and partially overlies the interlevel dielectric 14. A plasma nitride layer 16, so-called because it is formed by plasma-enhanced chemical vapor deposition, overlies the interlevel dielectric 14 and metal layer 15.

During a high temperature annealing process, hydrogen ions (H+) 17 contained in the nitride layer 16 can diffuse through the interlevel dielectric 14 into the polysilicon resistor 13. Once in the polysilicon, these hydrogen atoms are absorbed at the trap sites and the alteration in the resistor value occurs.

Several prior art approaches attempt to prevent hydrogen atoms from diffusing into polysilicon resistors. In *Silicon Processing for the VLSI ERA*, Vol. 1, by Wolf and Tauber, p. 222, it is revealed that silicon nitride can serve to block the diffusion of atomic hydrogen. U.S. Pat. No. 5,530,418 to Hsu et al shows polysilicon and metal layers preventing hydrogen intrusion to a polysilicon resistor therebetween. U.S. Pat. No. 5,236,857 to Eklund et al discloses a silicon nitride insulating layer over a polysilicon resistor. U.S. Pat. No. 5,470,764 to Ikegami et al discloses a silicon nitride layer under a polysilicon resistor. The silicon nitride is formed by implanting nitrogen into the polysilicon and then annealing. U.S. Pat. No. 5,290,727 to Jain et al teaches a silicon rich silicon dioxide layer over a polysilicon resistor. U.S. Pat. No. 5,728,615 to Cheng et al discloses an anneal to make the atomic hydrogen diffusion into the polysilicon resistor more uniform. U.S. Pat. No. 5,759,887 to Ito et al teaches the use of a silicon nitride layer over the polysilicon resistor. Finally, co-pending U.S. patent application Ser. No. 09/234,096 (TSMC-98-169) to Hsu et al filed on Jan. 19, 1999 discloses the use of a low-pressure silicon nitride cap as a barrier to reduce resistance variations from hydrogen intrusion of high-value polysilicon resistors. This approach requires the deposition of an additional silicon nitride film over the surface of the wafer that can slow manufacturing throughput.

SUMMARY OF THE INVENTION

A principal object of the present invention is to provide an effective and very manufacturable method of fabricating polysilicon resistors in the manufacture of integrated circuits.

A further object of the present invention is to provide a method for forming polysilicon resistors having reduced resistance variations.

A still further object of the present invention is to provide a method for forming polysilicon resistors having reduced resistance variations by using an oxynitride shield layer over the polysilicon resistor.

A yet still further object of the present invention is to provide a method for forming polysilicon resistors having reduced resistance variations by using an oxynitride shield layer selectively formed over the polysilicon resistor.

Another object of the present invention is to provide a method for forming an oxynitride shield layer to block the diffusion of hydrogen atoms into a polysilicon layer.

In accordance with the objects of this invention, a new method of fabricating polysilicon resistors has been achieved. This polysilicon resistor uses a hydrogen barrier of silicon oxynitride in the interlevel dielectric to shield the resistor from atomic hydrogen intrusion. A semiconductor substrate is provided. A field oxide isolation layer is provided and patterned over the surface of the substrate isolating active device regions. A polysilicon layer is deposited overlying the isolation layer and substrate. The polysilicon layer is selectively doped to provide lightly doped regions and heavily doped regions. The polysilicon is etched to define resistors, transistor gates, and other features. An interlevel dielectric layer is deposited overlying the resistors and isolation layer. Nitrogen, or a combination of nitrogen and oxygen, is implanted into the interlevel dielectric and annealed to form a silicon oxynitride shield layer in the interlevel dielectric. Contacts are etched through the interlevel dielectric to the polysilicon surface. A metal layer is deposited overlying the interlevel dielectric and filling contacts. This metal layer is etched to complete define connective features. A plasma nitride layer is formed overlying the metal layer and interlevel dielectric. This completes the formation of the polysilicon resistor with silicon oxynitride shield.

BRIEF DESCRIPTION OF THE DRAWINGS

In the accompanying drawings forming a material part of this description, there is shown.

DESCRIPTION OF THE PREFERRED EMBODIMENTS

The first preferred embodiment of the invention is illustrated in FIGS. 2 through 12.

Figure 2:
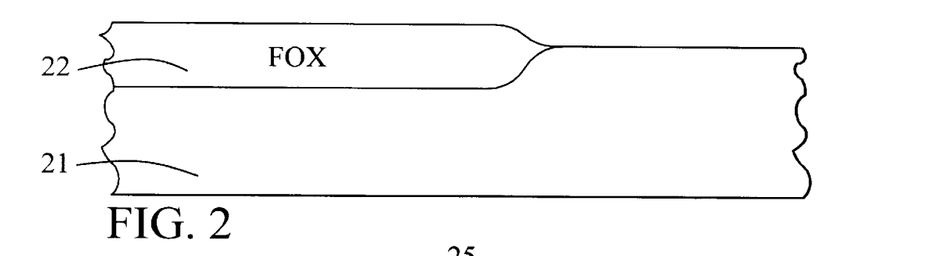
FIGS. 2 through 12 schematically illustrate in cross-sectional representation a first preferred embodiment of the present invention.

Referring now more particularly to FIG. 2, there is illustrated a cross section of a partially completed polysilicon resistor. Semiconductor substrate 21 is preferably composed of monocrystalline silicon. A field oxide isolation layer 22 is conventionally grown on the surface of the substrate in areas defined by a masking operation that is not shown. The isolation layer 22 defines and isolates active device regions.

Figure 3:
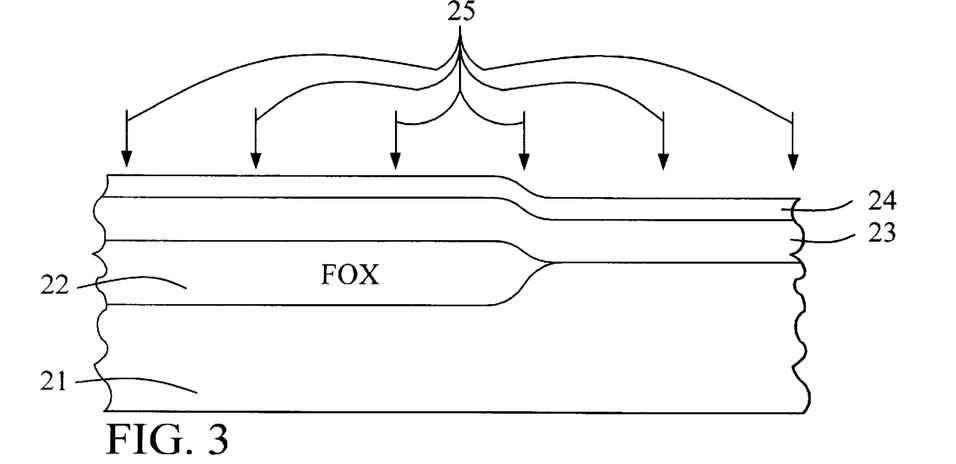

Referring now to FIG. 3, A polysilicon layer 23 is formed on the whole surface of the substrate 21, including overlying the isolation layer 22. This polysilicon layer 23 can be deposited by several methods common to the art, such as low-pressure chemical vapor deposition (LPCVD). In the preferred embodiment, the polysilicon layer is deposited using a low-pressure chemical vapor deposition (LPCVD) process to a thickness of between about 2000 and 4000 Angstroms.

The polysilicon is then oxidized to form a silicon dioxide layer 24 overlying the polysilicon layer 23 having a thickness of between about 100 and 300 Angstroms. This oxidation pre-anneals the polysilicon layer to stabilize resistance.

An ion implant 25 is performed through the silicon dioxide layer 24 into the polysilicon layer 23 to increase the resistivity of the polysilicon layer 23. In the preferred embodiment, phosphorous ions are implanted into the polysilicon layer 23 at a dosage of between about $1.0 \times 10^{15}$ and $5.0 \times 10^{16}$ atoms/cm$^2$ and energy of between about 30 and 70 KeV.

Figure 4:
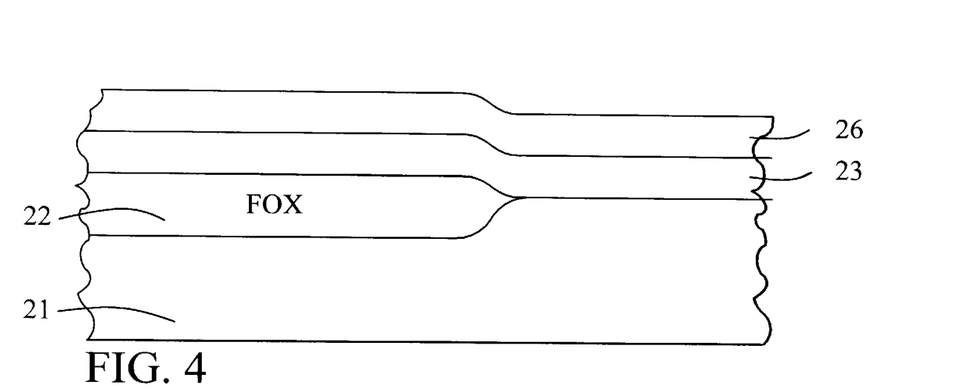

Referring now to FIG. 4, a silicon dioxide capping layer 26 is deposited overlying the first silicon dioxide layer 24. This combined layer will now be referred to as layer 26. The combined silicon dioxide layer has a thickness of between about 200 and 800 Angstroms.

Figure 5:
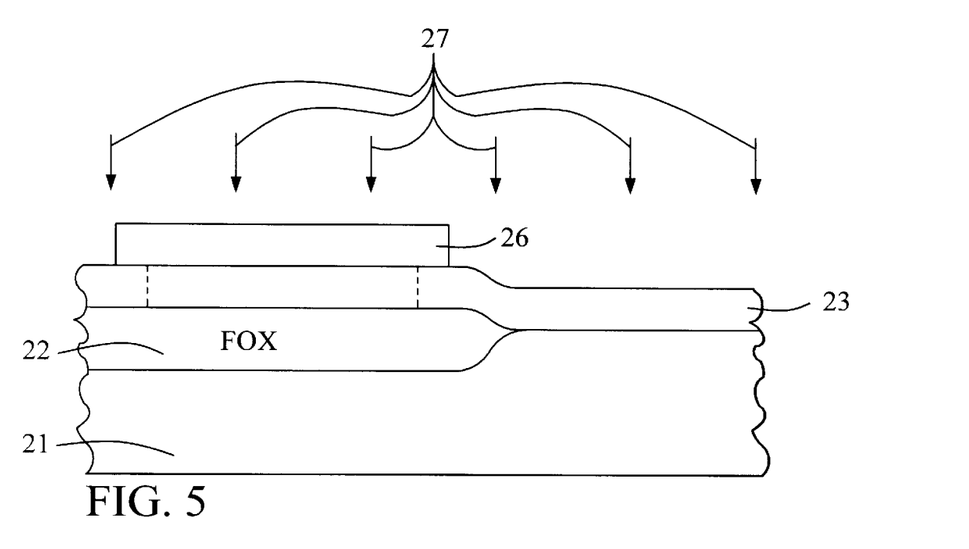

A photoresist mask, not shown, is formed over the surface of the capping layer 26. The capping layer 26 is etched away where it is not covered by the photoresist mask, as shown in FIG. 5. The capping layer 26 remains over the area where the resistor is to be formed, as indicated by the dotted line in FIG. 5.

A second ion implantation 27 is performed to dope the gate polysilicon. The capping layer 26 protects the future resistor from the gate implant. In the preferred embodiment, phosphorous ions are implanted into the polysilicon layer 23 at a dosage of between about $1.0 \times 10^{13}$ and $5.0 \times 10^{16}$ atoms/cm$^2$ and energy of between about 25 and 100 KeV.

Figure 6:
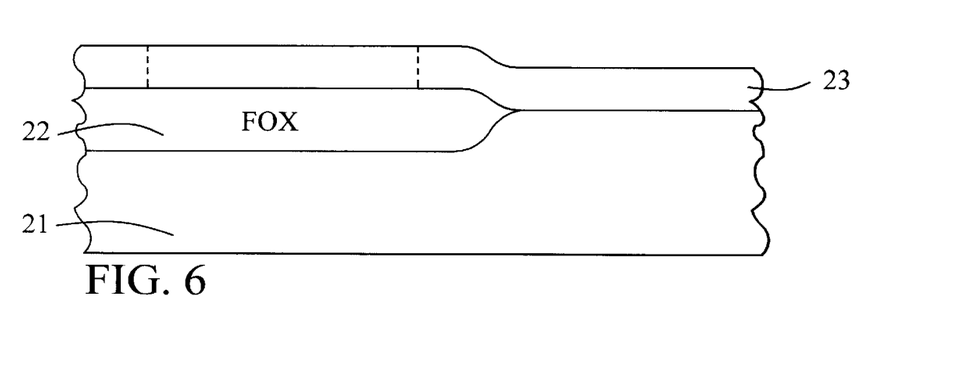
Figure 7:
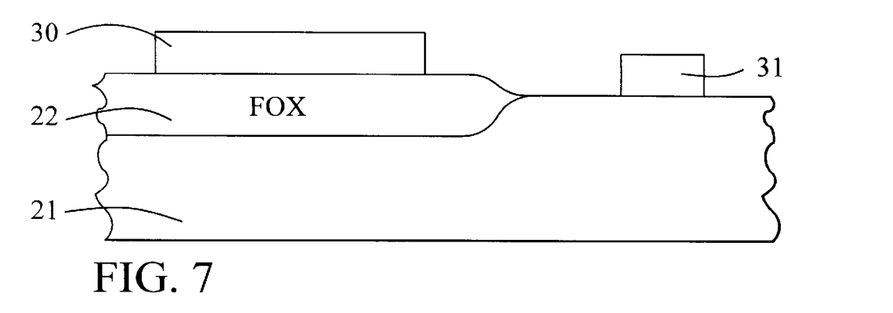

The capping layer is then removed, as shown in FIG. 6. A second photoresist mask, not shown, is formed over the polysilicon layer 23. Referring to FIG. 7, the polysilicon layer 23 is etched away where it is exposed by the photoresist mask to form polysilicon resistors, such as 30, and polysilicon gate electrodes, such as 31.

Figure 8:
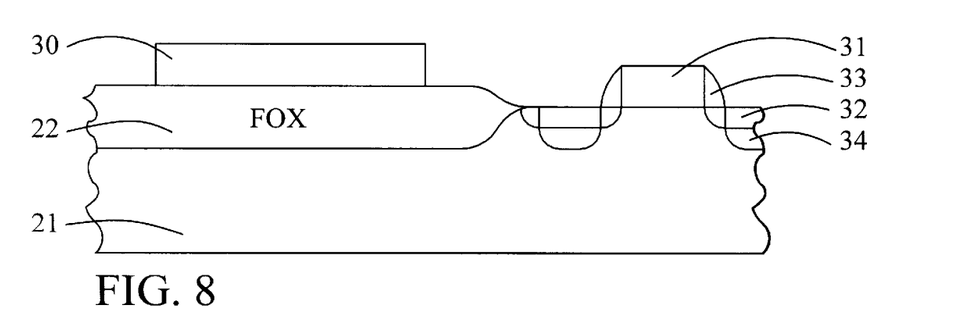

Now, as shown in FIG. 8, the device regions, lightly doped drain regions 32 and heavily doped drain regions 34 are formed in the substrate 21 using conventional means. Sidewall spacers 33 are formed on the transistor gates as typical in the art.

The remaining figures will illustrate only the resistor 30 portion of the integrated circuit device.

Figure 9:
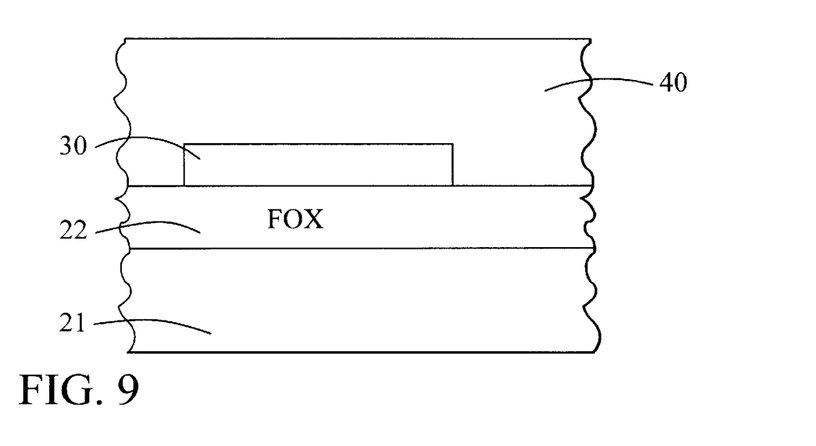

Referring now to FIG. 9, an interlevel dielectric layer 40 is deposited overlying the polysilicon layer 30 and the entire surface of the integrated circuit. This interlevel dielectric layer 40 is a key feature of the invention. This interlevel dielectric is composed of plasma-enhanced silicon oxide and is deposited using a Plasma-enhanced chemical vapor deposition process to a thickness of between about 4000 and 7000 Angstroms.

Although it is not essential to the preferred embodiment, this interlevel dielectric layer 40 could be doped with impurities. Borophosphosilicate glass (BPSG) or Borophosphosilicate oxide formed using tetraethyl orthosilicate (BP TEOS) could likewise be used to form the interlevel dielectric layer 40.

Figure 10:
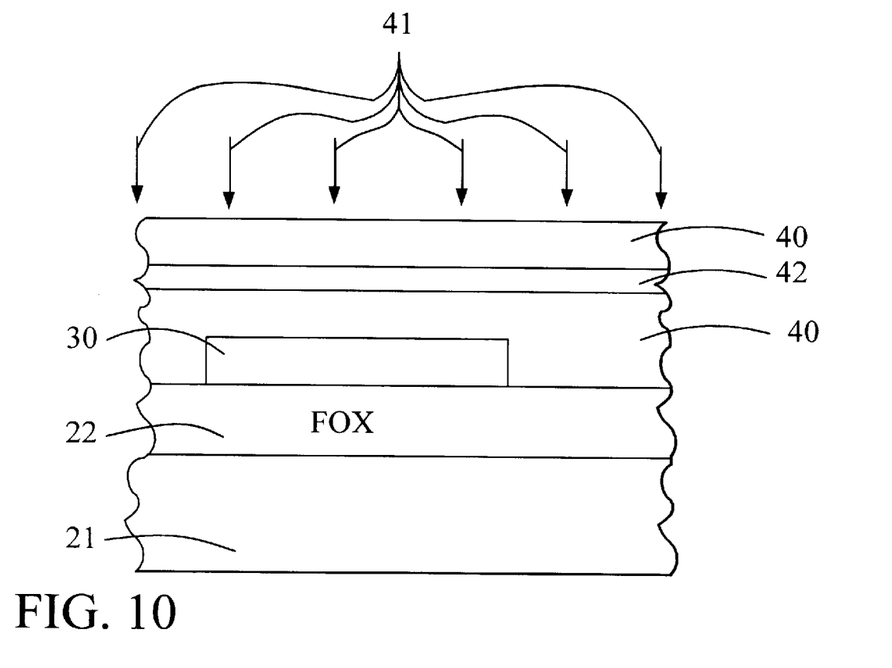

Next, another key feature of the invention is shown in FIG. 10. An ion implant 41 is performed to inject nitrogen, or a combination of nitrogen and oxygen, atoms into the interlevel dielectric 40. In the preferred embodiment, nitrogen ions are implanted into the interlevel dielectric 40 at a dosage of between about $1.0 \times 10^{13}$ and $5.0 \times 10^{16}$ atoms/cm$^2$ and energy of between about 25 and 100 KeV.

A rapid thermal process (RTP) anneal is performed to cause the implanted nitrogen ions to form a silicon oxynitride layer 42 in the interlevel dielectric 40. The anneal is performed in an environment of nitrogen or an inert gas ambient at between about 400 and 1000 degrees C. for between about 5 seconds and 30 minutes. The silicon oxynitride layer 42 formed has a thickness of between about 500 and 2000 Angstroms. The silicon oxynitride layer 42 is formed in a middle section of the interlevel dielectric layer 40. Although the depth of the oxynitride layer formed can be varied by changing the energy of the nitrogen implantation, the depth does not make a difference in the usefulness of the layer as a hydrogen barrier.

The novel approach of implanting nitrogen to form an oxynitride layer creates an effective barrier against hydrogen intrusion into the polysilicon resistor. In addition, this approach is simpler and has less impact on the manufacturing throughput than the approach of depositing a separate silicon nitride layer to create a diffusion barrier.

Figure 11:
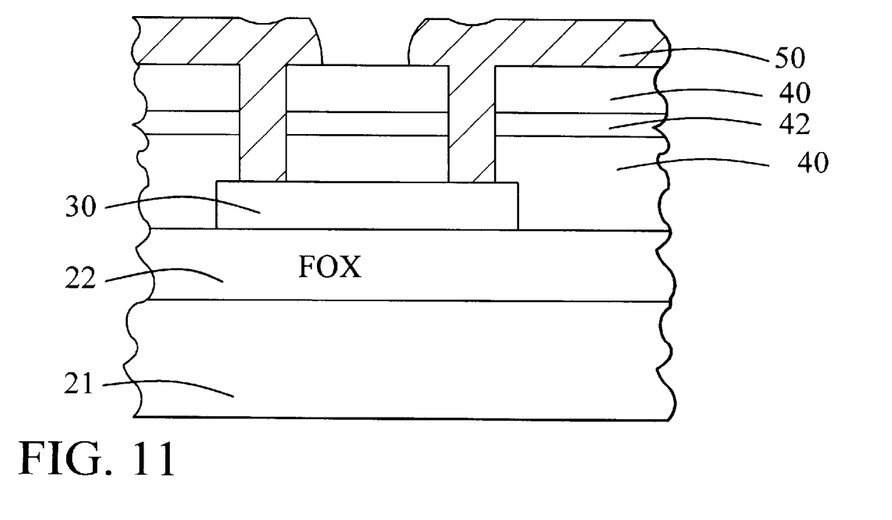

Referring now to FIG. 11, contacts are etched through the interlevel dielectric layer 40 and the oxynitride layer 42 to the polysilicon resistor 30. A metal layer 50 is deposited within the contact openings and patterned to form contacts using a conventional process.

Figure 12:
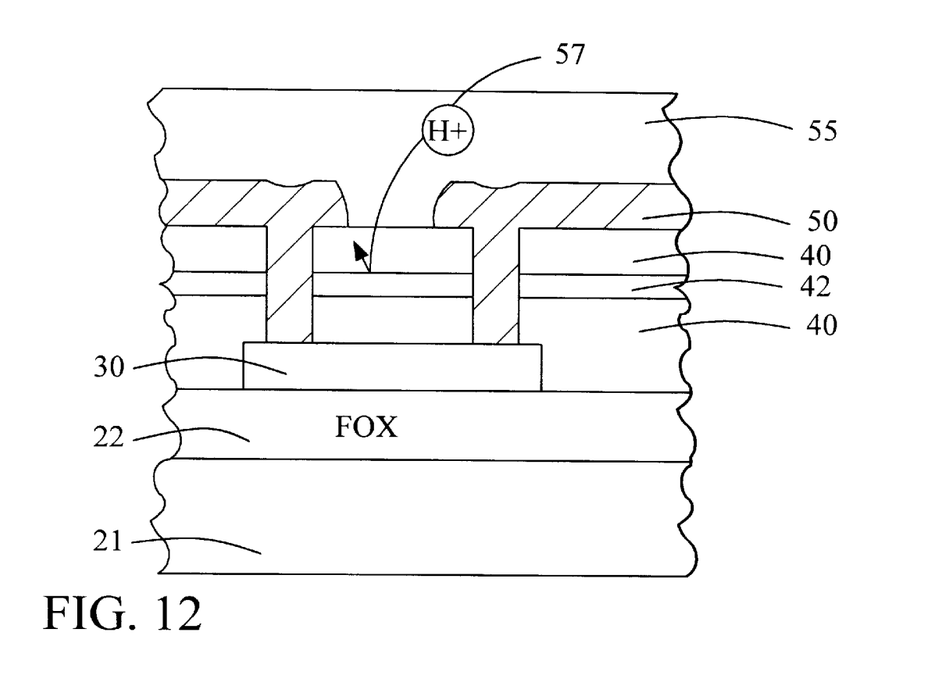

Referring to FIG. 12, a passivation layer 55 is deposited overlying the patterned metal layer 50. Typically, the passivation layer 55 is a plasma-enhanced chemical vapor deposition (PECVD) silicon nitride layer deposited to a thickness of between about 5000 and 10000 Angstroms over the surface of the substrate. This completes the fabrication of the polysilicon resistor in the integrated circuit of the first preferred embodiment.

The second preferred embodiment of the invention adds a mask module to the first embodiment so that the silicon oxynitride shield can be selectively formed, for instance, only over the polysilicon resistors and not over the transistor gates. The second embodiment is described in FIGS. 13 through 15. The second embodiment uses the same processing method disclosed in the first embodiment up to and including the deposition of the interlevel dielectric shown in FIG. 9.

Figure 13:
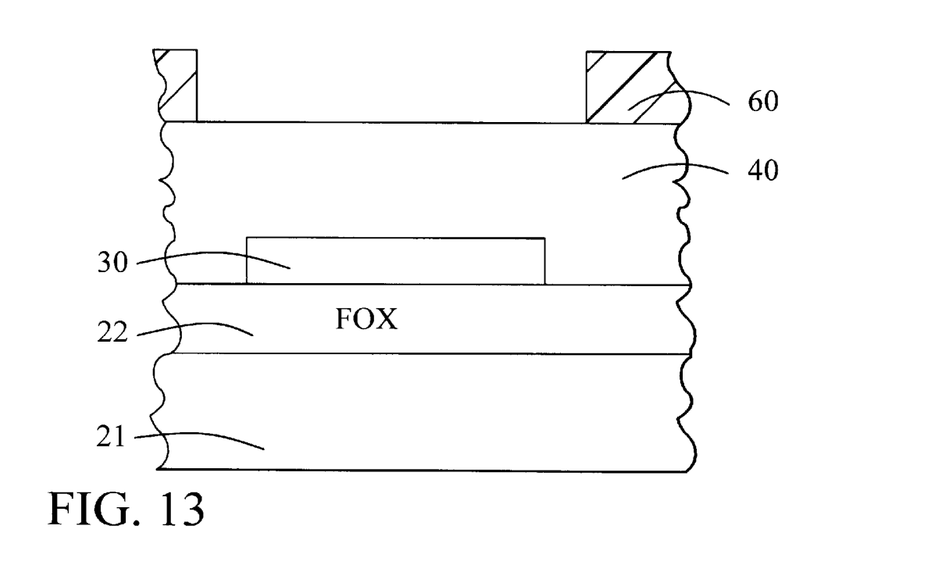
FIGS. 13 through 15 schematically illustrate in cross-sectional representation a second preferred embodiment of the present invention.

Referring now to FIG. 13, a photoresist layer 60 is deposited and defined using a conventional photolithography and etch sequence. The purpose of the photoresist layer 60 is to mask the nitrogen implant step from non-resistor areas, such as transistor gates.

Figure 14:
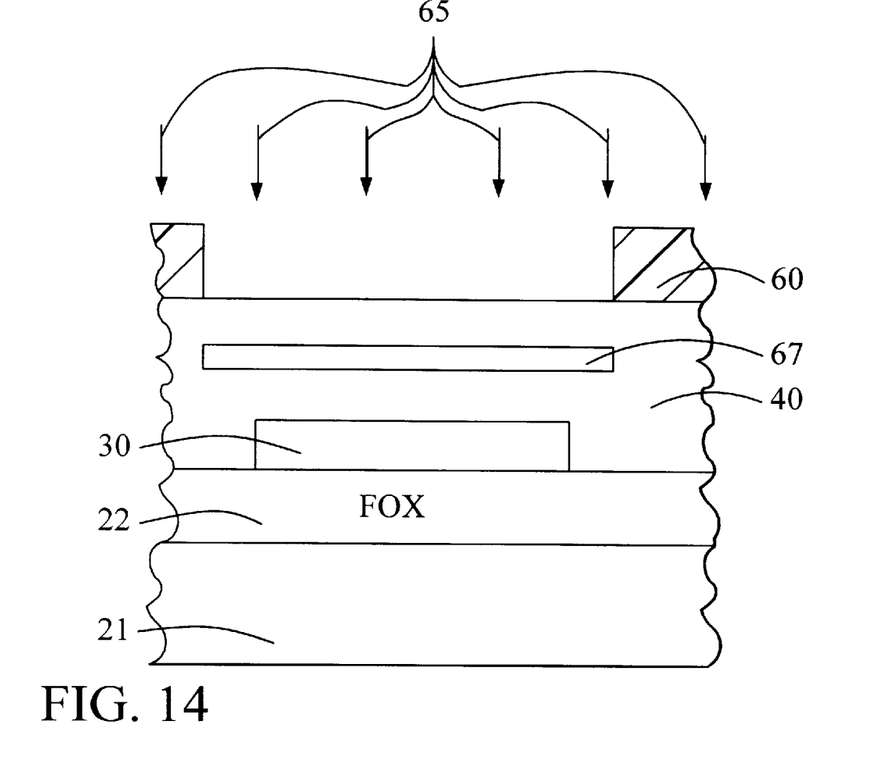

Referring to FIG. 14, an ion implant 65 is performed to inject nitrogen atoms, or a combination of nitrogen and oxygen atoms, into the interlevel dielectric 40. In the preferred embodiment, nitrogen ions are implanted into the interlevel dielectric 40 at a dosage of between about $1.0 \times 10^{13}$ and $5.0 \times 10^{16}$ atoms/cm$^2$ and energy of between about 25 and 100 KeV.

An RTP anneal is performed to cause the implanted nitrogen ions to form a silicon oxynitride layer 67 in the interlevel dielectric 40. The anneal is performed in an environment of nitrogen or an inert gas ambient at between about 400 and 1000 degrees C for between about 5 seconds and 30 minutes. The silicon oxynitride layer 42 formed has a thickness of between about 500 and 2000 Angstroms and is defined in between the openings of the photoresist layer 60.

Figure 15:
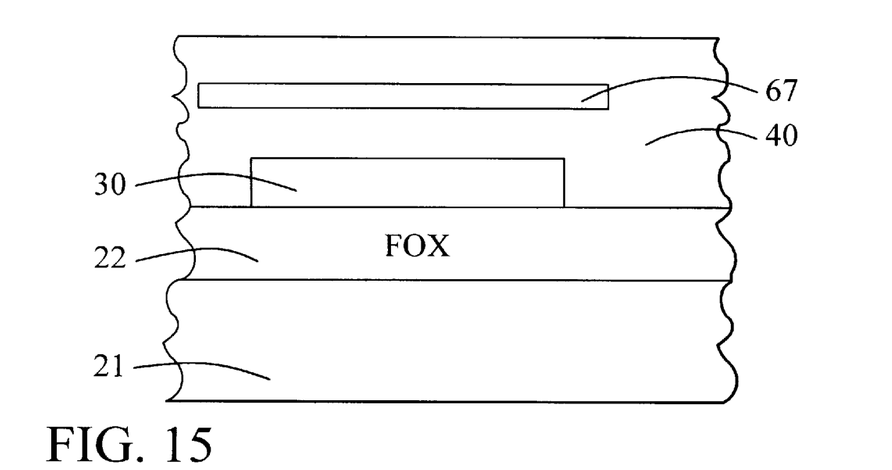

The photoresist layer 60 is removed as shown in FIG. 15. The polysilicon resistor of the integrated circuit is then completed using the processing method of the first embodiment beginning with the etching of contacts shown in FIG. 11.

It can now be demonstrated how the process features positively impact the performance of the polysilicon resistor. First, compare the cross-section of the partially completed polysilicon resistor of the preferred embodiment depicted in FIG. 12 with that of the prior art shown in FIG. 1. In the prior art it was revealed that hydrogen ions (H+) 17 contained in the nitride layer 16 can diffuse through the interlevel dielectric 14 into the polysilicon resistor 13 during a high temperature annealing process. In the present invention, however, the hydrogen atoms (H+) 57 cannot penetrate the barrier of the silicon oxynitride shield 40 to enter the polysilicon resistor 30. Because the hydrogen atoms do not enter the resistor, the resistivity of the polysilicon is more controlled and, therefore, the resistor values of the integrated circuit are more predictable.

Additionally, the present invention process improves the planarity of the interlayer dielectric layer without increasing the process complexity. The nitrogen implant causes damage to the interlevel dielectric layer. The RTP anneal not only anneals out this damage, but it also makes the layer more planar.

The process of the present invention provides a very manufacturable process for forming polysilicon resistors with effective shields from atomic hydrogen through the formation of a silicon oxynitride layer.

While the invention has been particularly shown and described with reference to the preferred embodiments thereof, it will be understood by those skilled in the art that various changes in form and details may be made without departing from the spirit and scope of the invention.

What is claimed is:

1. A method of forming a polysilicon resistor in an integrated circuit comprising:

providing a semiconductor substrate;

providing field oxide isolation regions overlying said substrate;

depositing a polysilicon layer overlying said field oxide regions and said substrate;

etching said polysilicon layer where it is not covered by a mask to form a polysilicon resistor;

depositing an interlevel dielectric layer overlying said polysilicon resistor;

implanting nitrogen ions into said interlevel dielectric layer;

annealing said interlevel dielectric layer to form a silicon oxynitride shield layer in said interlevel dielectric layer;

etching contact openings through said interlevel dielectric layer to said polysilicon resistor;

filling said contact openings with a metal layer;

patterning said metal layer;

covering said patterned metal layer with a passivation layer wherein said passivation layer contains hydrogen atoms and wherein said silicon oxynitride shield layer prevents hydrogen atoms from penetrating said polysilicon resistor; and completing said integrated circuit.

2. The method according to claim 1 wherein said polysilicon layer is formed to a thickness of between about 2000 and 4000 Angstroms.

3. The method according to claim 1 after said step of depositing said polysilicon layer further comprising:

growing a first silicon dioxide layer on said polysilicon layer;

implanting first ions through said first dioxide layer into said polysilicon layer to dope said polysilicon layer;

depositing a capping oxide layer overlying said first oxide layer and patterning said capping oxide layer and said first oxide layer to cover planned said polysilicon resistor;

implanting second ions into said polysilicon layer to provide gate doping wherein said capping oxide layer over planned said polysilicon resistor prevents said second ions from penetrating planned said resistor; and thereafter removing said capping oxide layer and said first oxide layer.

4. The method according to claim 1 wherein said interlevel dielectric layer is comprised of plasma-enhanced silicon oxide having a thickness of between about 6000 and 7000 Angstroms.

5. The method according to claim 1 wherein said step of implantation of nitrogen ions into said interlevel dielectric layer is completed at a dose of between about $1.0 \times 10^{13}$ and $5.0 \times 10^{16}$ ions/cm$^2$ at an energy of between about 25 and 100 KeV.

6. The method according to claim 1 wherein said step of annealing said interlevel dielectric layer is completed by a rapid thermal anneal process at a temperature of between about 400 and 1000 degrees C. for between about 5 seconds and 30 minutes.

7. The method according to claim 1 wherein said implanting of nitrogen atoms comprises implanting of a combination of nitrogen and oxygen atoms.

8. A method of forming a polysilicon resistor in an integrated circuit comprising:

providing a semiconductor substrate;

providing field oxide isolation regions overlying said substrate;

depositing a polysilicon layer overlying said field oxide regions and said substrate;

etching said polysilicon layer where it is not covered by a mask to form a polysilicon resistor;

depositing an interlevel dielectric layer overlying said polysilicon resistor;

depositing a photoresist layer overlying said interlevel dielectric layer;

etching said photoresist layer to form an opening wherein underlying said polysilicon resistor is completely contained within said opening;

implanting nitrogen ions through said opening into said interlevel dielectric layer;

removing said photoresist layer;

annealing said interlevel dielectric layer to form a silicon oxynitride shield layer in said interlevel dielectric layer;

etching contact openings through said interlevel dielectric layer to said polysilicon resistor;

filling said contact openings with a metal layer;

patterning said metal layer;

covering said patterned metal layer with a passivation layer wherein said passivation layer contains hydrogen atoms and wherein said silicon oxynitride shield layer prevents hydrogen atoms from penetrating said polysilicon resistor; and completing said integrated circuit.

9. The method according to claim 8 wherein said polysilicon layer is formed to a thickness of between about 2000 and 4000 Angstroms.

10. The method according to claim 8 after said step of depositing said polysilicon layer further comprising:

growing a first silicon dioxide layer on said polysilicon layer;

implanting first ions through said first dioxide layer into said polysilicon layer to dope said polysilicon layer;

depositing a capping oxide layer overlying said first oxide layer and patterning said capping oxide layer and said first oxide layer to cover planned said polysilicon resistor;

implanting second ions into said polysilicon layer to provide gate doping wherein said capping oxide layer over planned said polysilicon resistor prevents said second ions from penetrating planned said resistor; and thereafter removing said capping oxide layer and said first oxide layer.

11. The method according to claim 8 wherein said interlevel dielectric layer is comprised of plasma-enhanced silicon oxide having a thickness of between about 6000 and 7000 Angstroms.

12. The method according to claim 8 wherein said step of implantation of nitrogen ions into said interlevel dielectric layer is completed at a dose of between about $1.0 \times 10^{13}$ and $5.0 \times 10^{16}$ ions/cm$^2$ at an energy of between about 25 and 100 KeV.

13. The method according to claim 8 wherein said step of annealing said interlevel dielectric layer is completed by a rapid thermal anneal process at a temperature of between about 400 and 1000 degrees C. for between about 5 seconds and 30 minutes.

14. The method according to claim 8 wherein said implanting of nitrogen atoms comprises implanting of a combination of nitrogen and oxygen atoms.

15. The method according to claim 8 wherein said silicon oxynitride shield is formed to a thickness of between about 500 and 2000 Angstroms.

16. A method of forming a hydrogen barrier layer in an integrated circuit comprising:

providing a semiconductor substrate;

depositing an interlevel dielectric layer overlying said substrate;

implanting nitrogen ions into said interlevel dielectric layer;

annealing said interlevel dielectric layer to form a silicon oxynitride barrier layer in said interlevel dielectric layer wherein said silicon oxynitride barrier layer forms said hydrogen barrier layer; and completing said integrated circuit.

17. The method according to claim 16 wherein said interlevel dielectric layer is comprised of plasma-enhanced silicon oxide having a thickness of between about 4000 and 7000 Angstroms.

18. The method according to claim 16 wherein said step of implantation of nitrogen ions into said interlevel dielectric layer is completed at a dose of between about $1.0 \times 10^{13}$ and $5.0 \times 10^{16}$ ions/cm$^2$ at an energy of between about 25 and 100 KeV.

19. The method according to claim 16 wherein said step of annealing said interlevel dielectric layer is completed by rapid thermal anneal process at a temperature of between about 600 and 1000 degrees C. for between about 5 seconds and 30 minutes.

20. The method according to claim 16 wherein said implanting of nitrogen atoms comprises implanting of a combination of nitrogen and oxygen atoms.

* * * * *